(12) United States Patent
Wang et al.

(10) Patent No.: US 12,426,520 B2
(45) Date of Patent: Sep. 23, 2025

(54) RESISTIVE RANDOM ACCESS MEMORY DEVICE AND FABRICATION METHOD THEREOF

(71) Applicant: UNITED MICROELECTRONICS CORP., Hsin-Chu (TW)

(72) Inventors: Wen-Jen Wang, Tainan (TW);
Yu-Huan Yeh, Hsinchu (TW);
Chuan-Fu Wang, Miaoli County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 422 days.

(21) Appl. No.: 18/112,483

(22) Filed: Feb. 21, 2023

(65) Prior Publication Data
US 2024/0260490 A1 Aug. 1, 2024

(30) Foreign Application Priority Data

Jan. 30, 2023 (TW) .................. 112102908

(51) Int. Cl.
*H10N 70/00* (2023.01)
*H10N 70/20* (2023.01)

(52) U.S. Cl.
CPC ....... *H10N 70/8418* (2023.02); *H10N 70/011* (2023.02); *H10N 70/24* (2023.02); *H10N 70/8833* (2023.02)

(58) Field of Classification Search
CPC ............. H10N 70/011; H10N 70/8418; H10N 70/841; H10N 70/826; H10N 70/24; H10N 70/8833; H10N 70/8828; H10N 70/20; H10N 70/231; H10N 70/066; H10N 70/021; H10B 63/82; H10B 63/30; G11C 2213/52
See application file for complete search history.

(56) References Cited

U.S. PATENT DOCUMENTS

| | | | |
|---|---|---|---|
| 10,510,952 B2 * | 12/2019 | Sung | H10N 70/20 |
| 11,296,147 B2 * | 4/2022 | Chiu | H10B 63/80 |
| 2008/0061341 A1 * | 3/2008 | Lung | H10B 63/30 257/532 |
| 2017/0309682 A1 * | 10/2017 | Chou | H01L 23/5226 |
| 2019/0229264 A1 * | 7/2019 | Karpov | H10N 70/826 |
| 2023/0380309 A1 * | 11/2023 | Sung | H10N 70/8833 |
| 2024/0107902 A1 * | 3/2024 | Wang | H10B 63/80 |

* cited by examiner

*Primary Examiner* — Mouloucoulaye Inoussa
(74) *Attorney, Agent, or Firm* — Winston Hsu

(57) ABSTRACT

A resistive memory device includes a substrate; a dielectric layer disposed on the substrate; a conductive via disposed in the dielectric layer; and a memory stack structure disposed on the conductive via and the dielectric layer. The memory stack structure includes a bottom electrode layer, a resistive switching layer on the bottom electrode layer, and a top electrode layer on the resistive switching layer. The top electrode layer includes at least two physically separated sub-electrode portions.

20 Claims, 5 Drawing Sheets

RESISTIVE RANDOM ACCESS MEMORY DEVICE AND FABRICATION METHOD THEREOF

BACKGROUND OF THE INVENTION

1. Field of the Invention

The invention relates to the technical field of semiconductor technology, in particular to an improved resistive memory device and a manufacturing method thereof.

2. Description of the Prior Art

Semiconductor memory devices are used in computer and electronics industries as a means for retaining digital information or data. Typically, the semiconductor memory devices are divided into volatile and non-volatile memory devices. The volatile memory device is a computer memory that loses its stored data when power to the operation is interrupted. Comparatively, in the non-volatile memory device, the stored data will not be lost when the power supply is interrupted.

The resistive random access memory (RRAM) is a kind of non-volatile memory technology having the characteristics of low operating voltage, low power consumption, and high writing speed and is regarded as a memory structure that can be applied to many electronic devices. The resistive memory device can be switched between a low resistance state and a high resistance state, and how to increase the read current of the resistive memory device in the low resistance state is one of the bottlenecks in this technical field.

SUMMARY OF THE INVENTION

It is one object of the present invention to provide an improved resistive memory device and its manufacturing method to solve the deficiencies or shortcomings of the prior art.

One aspect of the invention provides a resistive memory device including a substrate; a dielectric layer disposed on the substrate; a conductive via disposed in the dielectric layer; and a memory stack structure disposed on the conductive via and the dielectric layer. The memory stack structure includes a bottom electrode layer, a resistive switching layer on the bottom electrode layer, and a top electrode layer on the resistive switching layer. The top electrode layer includes at least two physically separated sub-electrode portions.

According to some embodiments, the resistive memory device further includes a dielectric wall interposed between the at least two physically separated sub-electrode portions.

According to some embodiments, the dielectric wall penetrates through an entire thickness of the top electrode layer.

According to some embodiments, the dielectric wall is in direct contact with the resistive switching layer.

According to some embodiments, the dielectric wall includes silicon nitride.

According to some embodiments, the dielectric wall has a thickness that is greater than or equal to 10 angstroms.

According to some embodiments, the resistive memory device further includes a dielectric cap disposed on the top electrode layer and the dielectric wall.

According to some embodiments, the dielectric cap includes silicon oxide.

According to some embodiments, the resistive memory device further includes a spacer disposed on a sidewall of the memory stack structure.

According to some embodiments, the top electrode layer includes a titanium nitride (TiN) layer and iridium (Ir) layer, and the resistive switching layer includes a tantalum pentoxide ($Ta_2O_5$) layer and a tantalum oxide ($TaO_x$) layer.

Another aspect of the invention provides a method for forming a resistive memory device. A substrate is provided. A dielectric layer is formed on the substrate. A conductive via is formed in the dielectric layer. A memory stack structure is formed on the conductive via and the dielectric layer. The memory stack structure includes a bottom electrode layer, a resistive switching layer on the bottom electrode layer, and a top electrode layer on the resistive switching layer. The top electrode layer includes at least two physically separated sub-electrode portions.

According to some embodiments, the method further includes the step of forming a dielectric wall between the at least two physically separated sub-electrode portions.

According to some embodiments, the dielectric wall penetrates through an entire thickness of the top electrode layer.

According to some embodiments, the dielectric wall is in direct contact with the resistive switching layer.

According to some embodiments, the dielectric wall includes silicon nitride.

According to some embodiments, the dielectric wall has a thickness that is greater than or equal to 10 angstroms.

According to some embodiments, the method further includes the step of forming a dielectric cap on the top electrode layer and the dielectric wall.

According to some embodiments, the dielectric cap includes silicon oxide.

According to some embodiments, the method further includes the step of forming a spacer on a sidewall of the memory stack structure.

According to some embodiments, the top electrode layer includes a titanium nitride (TiN) layer and iridium (Ir) layer, and the resistive switching layer includes a tantalum pentoxide ($Ta_2O_5$) layer and a tantalum oxide ($TaO_x$) layer.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized, and structural, logical, and electrical changes may be made without departing from the scope of the present invention. Therefore, the following detailed description is not to be considered as limiting, but the embodiments included herein are defined by the scope of the accompanying claims.

Figure 1:
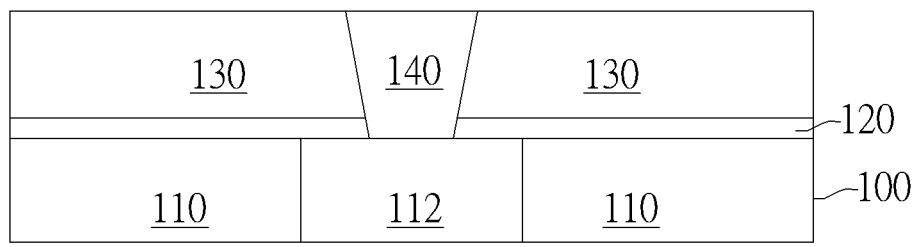
FIG. 1 to FIG. 10 are schematic diagrams of a method for forming a resistive memory device according to an embodiment of the present invention.

Please refer to FIG. 1 to FIG. 10, which are schematic diagrams of a method for forming a resistive memory device according to an embodiment of the present invention. As shown in FIG. 1, first, a substrate 100 is provided. For example, the substrate 100 may be a semiconductor substrate such as a silicon substrate. Next, a dielectric layer 110 is formed on the substrate 100 by using a deposition process. According to an embodiment of the present invention, for example, the dielectric layer 110 may include a silicon oxide layer or a low dielectric constant material layer, but is not limited thereto. Subsequently, a metallization process, such as copper damascene process, is performed to form the conductive layer 112 in the dielectric layer 110. According to an embodiment of the present invention, for example, the conductive layer 112 may be a copper damascene layer, but is not limited thereto. Subsequently, an etch stop layer 120 is formed on the conductive layer 112 and the dielectric layer 110 using a deposition process. According to an embodiment of the present invention, for example, the etch stop layer 120 may include a nitrogen-doped silicon carbide (NDC) layer, but is not limited thereto. Subsequently, a dielectric layer 130 is formed on the etch stop layer 120 by using a deposition process. According to an embodiment of the present invention, for example, the dielectric layer 130 may include a silicon oxide layer or a low dielectric constant material layer, but is not limited thereto. Subsequently, a conductive via 140 may be formed in the dielectric layer 130 by using processes such as lithography, etching and deposition. According to an embodiment of the present invention, for example, the conductive via 140 may include tungsten, but is not limited thereto.

Figure 2:
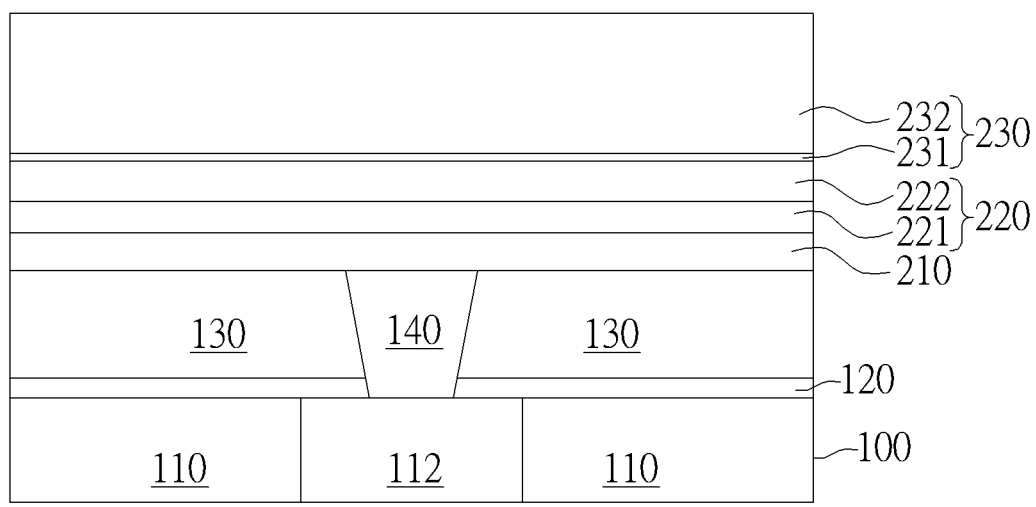

As shown in FIG. 2, next, a deposition process is performed to sequentially form a bottom electrode layer 210, a resistive switching layer 220 and a top electrode layer 230 on the conductive via 140 and the dielectric layer 130. According to an embodiment of the present invention, for example, the bottom electrode layer 210 may include tantalum nitride (TaN) or titanium nitride (TiN), but is not limited thereto. According to an embodiment of the present invention, for example, the top electrode layer 230 may include an iridium (Ir) layer 231 and a tantalum nitride (TaN) or titanium nitride (TiN) layer 232, but is not limited thereto. According to an embodiment of the present invention, for example, the resistive switching layer 220 may include a tantalum oxide ($TaO_x$) layer 221 and a tantalum pentoxide ($Ta_2O_5$) layer 222.

Figure 3:
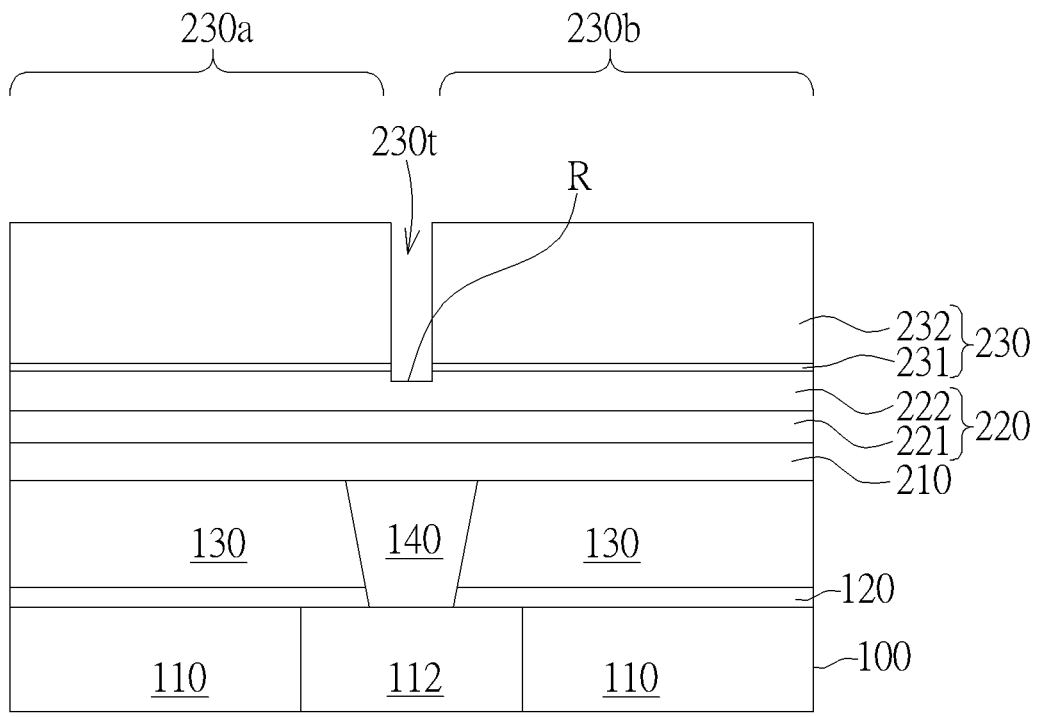

As shown in FIG. 3, lithography and etching processes are then performed to form a trench 230t in the top electrode layer 230. According to an embodiment of the present invention, the trench 230t penetrates through the entire thickness of the top electrode layer 230. According to an embodiment of the present invention, the above etching process may include an over-etch step to form a recessed region R on the tantalum pentoxide ($Ta_2O_5$) layer 222. According to an embodiment of the invention, the bottom of the trench 230t exposes a portion of the surface of the resistive switching layer 220. According to an embodiment of the present invention, the trench 230t cuts the top electrode layer 230 into two physically separated sub-electrode portions 230a and 230b. According to some embodiments of the present invention, two or more trenches may be formed to cut the top electrode layer 230 into three or more physically separated sub-electrode portions.

Figure 4:
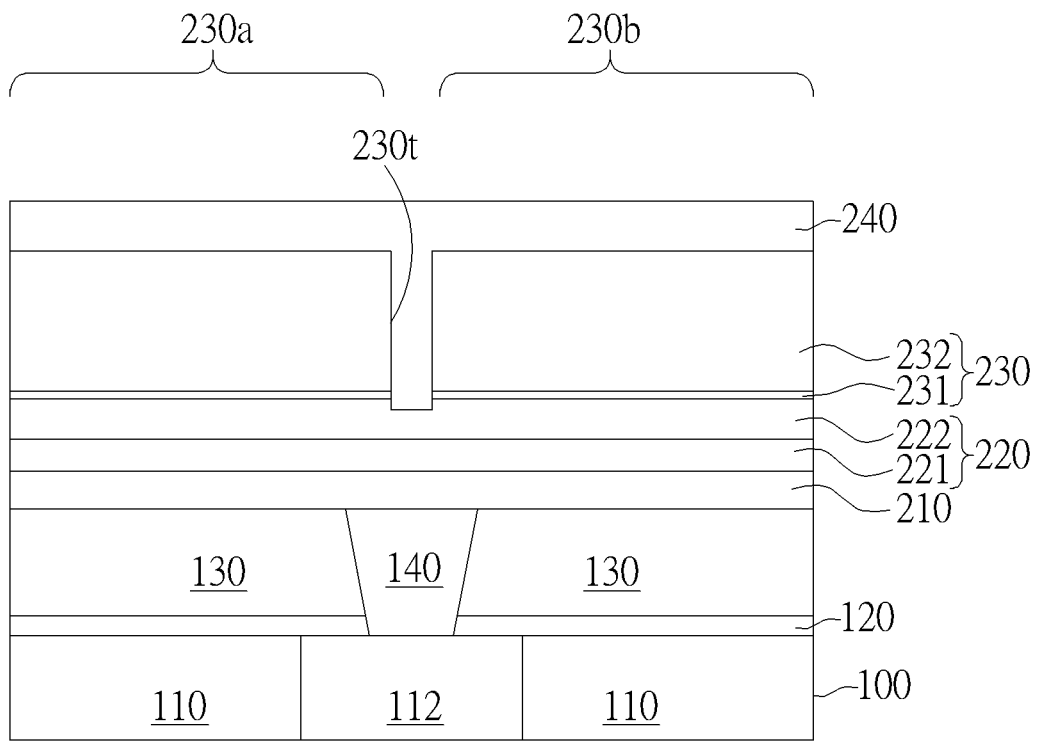

As shown in FIG. 4, next, a deposition process, such as a chemical vapor deposition process, is performed to deposit an insulating layer 240 on the top electrode layer 230 and the insulating layer 240 is filled into the trench 230t. According to an embodiment of the present invention, for example, the insulating layer 240 may include silicon nitride, but is not limited thereto. According to an embodiment of the present invention, for example, the insulating layer 240 may be formed using an atomic layer deposition (ALD) process.

Figure 5:
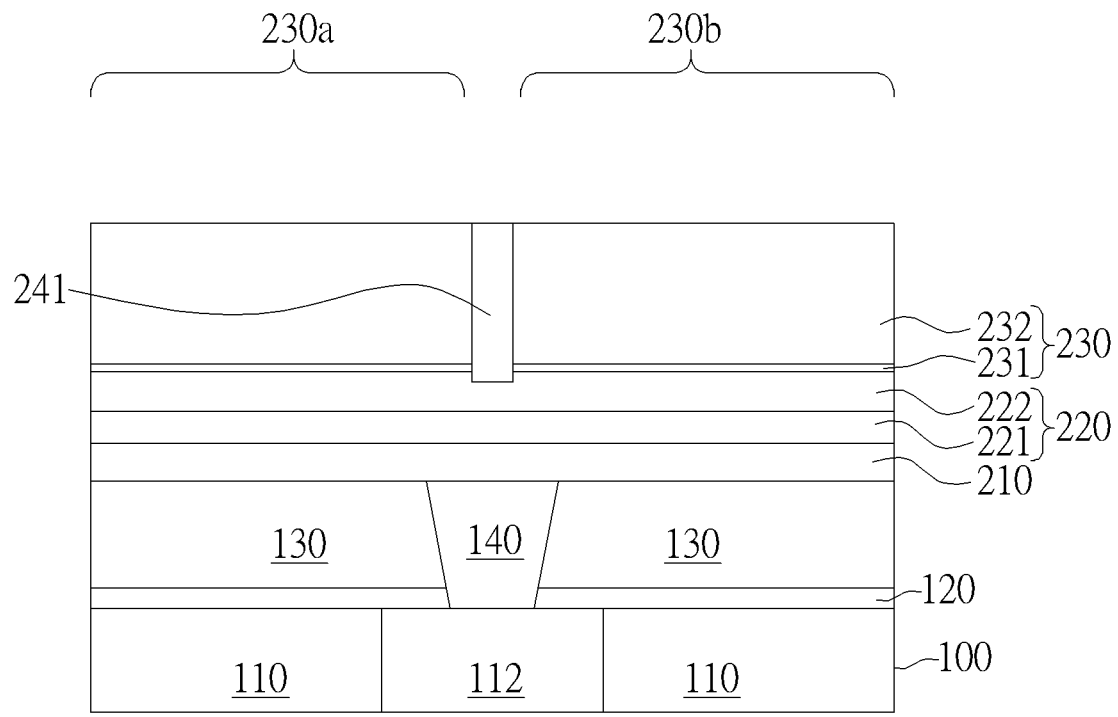

As shown in FIG. 5, a planarization process, such as a chemical mechanical polishing (CMP) process, is then performed to polish the insulating layer 240 on the top electrode layer 230, leaving the insulating layer 240 in the trench 230t, thus forming a dielectric wall 241 between the sub-electrode portions 230a and 230b. According to an embodiment of the present invention, the dielectric wall 241 directly contacts the resistive switching layer 220. According to the embodiment of the present invention, the thickness of the dielectric wall 241 is preferably greater than or equal to 10 angstroms, so as to avoid the punch-through phenomenon caused by the memory device under high voltage operation.

Figure 6:
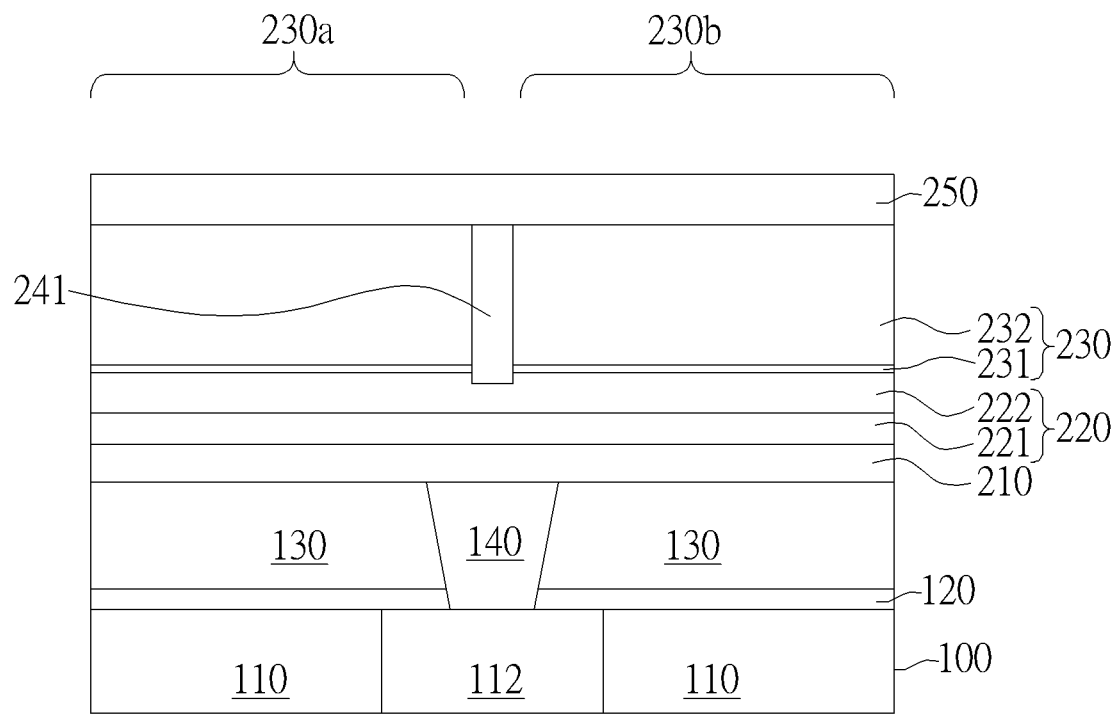

As shown in FIG. 6, next, a deposition process, such as a chemical vapor deposition process is performed to deposit an insulating layer 250 on the top electrode layer 230 and the dielectric wall 241. According to an embodiment of the present invention, for example, the insulating layer 250 may include silicon oxide, but is not limited thereto. According to an embodiment of the present invention, the insulating layer 250 directly contacts the dielectric wall 241.

Figure 7:
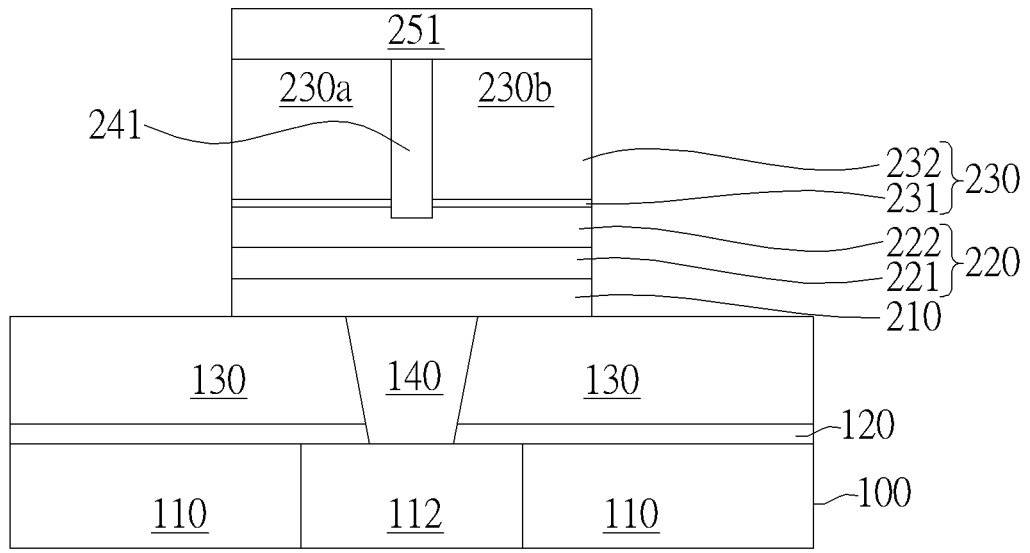

As shown in FIG. 7, lithography and etching processes are then performed to define a memory stack structure SS of a bit cell. According to an embodiment of the present invention, the memory stack structure SS includes a bottom electrode layer 210, a resistive switching layer 220 on the bottom electrode layer 210, and a top electrode layer 230 on the resistive switching layer 220. The top electrode layer 230 includes the sub-electrode portions 230a and 230b separated by the dielectric wall 241. According to an embodiment of the present invention, a dielectric cap 251 is formed on the top electrode layer 230 and the dielectric wall 241.

Figure 8:
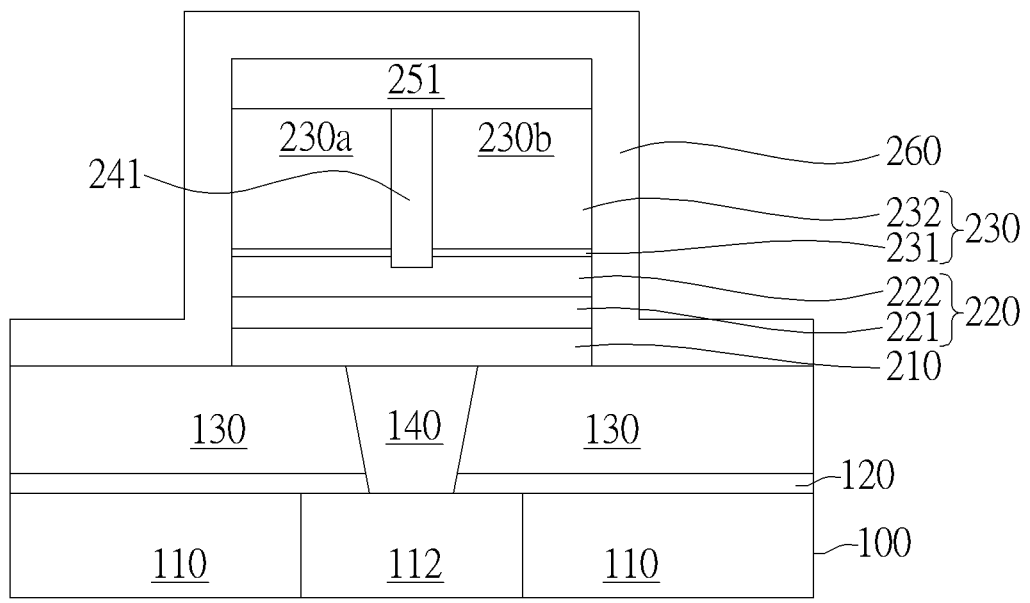

As shown in FIG. 8, next, a deposition process, such as a chemical vapor deposition process, is performed to conformally deposit a spacer layer 260 on the surface of the memory stack structure SS and the dielectric layer 130. According to an embodiment of the present invention, for example, the spacer layer 260 may include silicon nitride or silicon oxynitride, but is not limited thereto.

Figure 9:
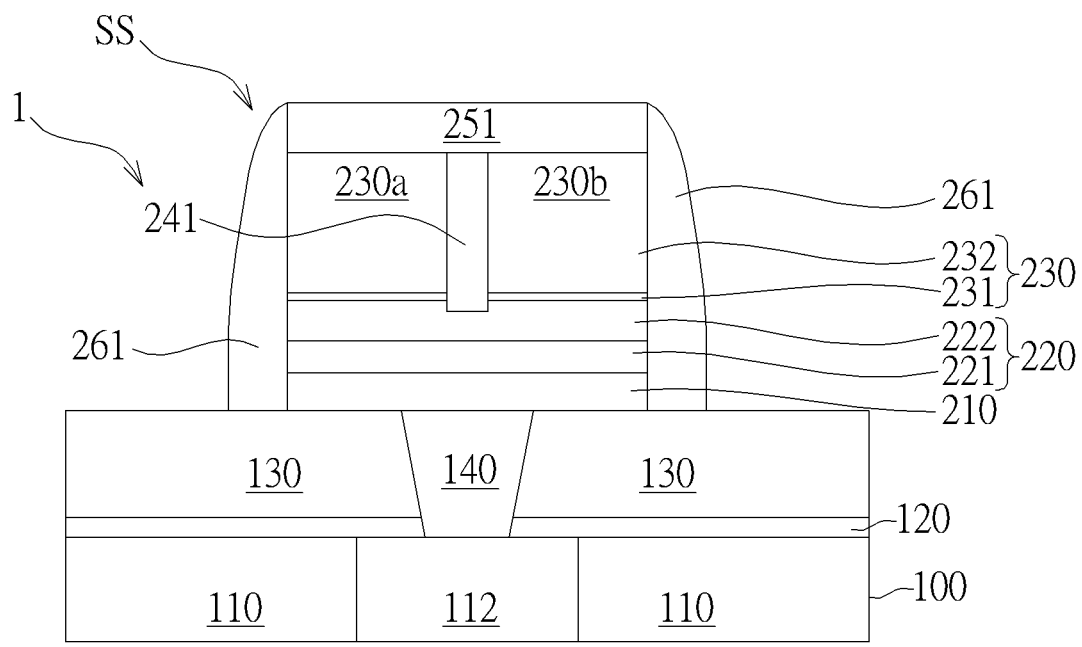

As shown in FIG. 9, an etching process, such as an anisotropic dry etching process, is then performed to etch the spacer layer 260 to form spacers 261 on the sidewalls of the memory stack structure SS, thus completing the fabrication of the resistive memory device 1.

Figure 10:
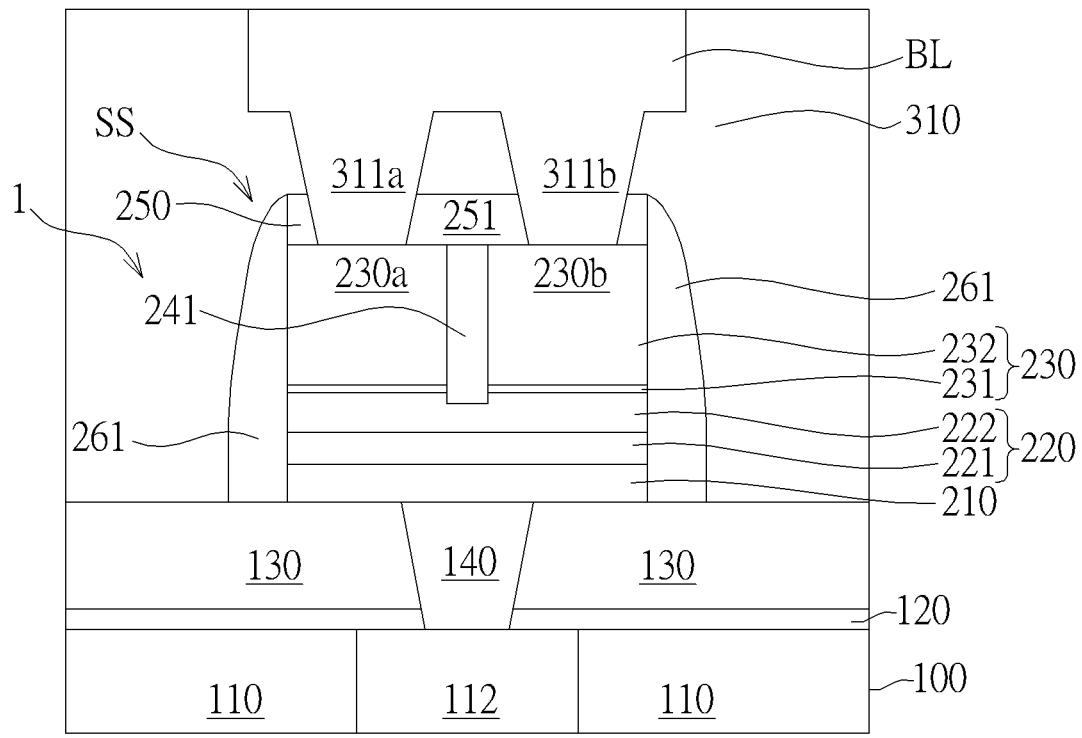

As shown in FIG. 10, a deposition process, such as a chemical vapor deposition process, is then performed to form a dielectric layer 310 on the surface of the memory stack structure SS and the dielectric layer 130. According to an embodiment of the present invention, for example, the dielectric layer 310 may include a silicon oxide layer or a low dielectric constant material layer, but is not limited thereto. A metallization process, such as copper damascene process, is then performed to form the bit line BL in the dielectric layer 310 and the conductive vias 311a and 311b electrically connected to the sub-electrode portions 230a and 230b, respectively. According to an embodiment of the present invention, for example, the bit line BL and the conductive vias 311a and 311b may be composed of a copper damascene layer, but are not limited thereto.

The resistive memory device 1 of the present invention has a split top electrode layer 230, which includes at least two physically separated sub-electrode portions 230a and 230b. During operation, conductive filaments are formed in the resistive switching layer 220 directly under the sub-electrode parts 230a and 230b, respectively, thereby increasing the read current of the resistive memory device 1 under the low resistance state.

Structurally, as shown in FIG. 10, the resistive memory device 1 includes a substrate 100; a dielectric layer 130 disposed on the substrate 100; a conductive via 140 disposed in the dielectric layer 130; and a memory stack structure SS disposed on the conductive via 140 and the dielectric layer 130. The memory stack structure SS includes a bottom electrode layer 210, a resistive switching layer 220 on the bottom electrode layer 210, and a top electrode layer 230 on the resistive switching layer 220. The top electrode layer 230 includes at least two physically separated sub-electrode portions 230a and 230b.

According to an embodiment of the present invention, the top electrode layer 230 includes an iridium (Ir) layer 231 and a titanium nitride (TiN) layer 232. According to an embodiment of the present invention, the resistive switching layer 220 includes a tantalum oxide ($TaO_x$) layer 221 and a tantalum pentoxide ($Ta_2O_5$) layer 222.

According to an embodiment of the present invention, the resistive memory device 1 further includes a dielectric wall 241 interposed between the at least two physically separated sub-electrode portions 230a and 230b. According to an embodiment of the present invention, the dielectric wall 241 runs through the entire thickness of the top electrode layer 230. According to an embodiment of the present invention, the dielectric wall 241 directly contacts the resistive switching layer 220. According to an embodiment of the present invention, the dielectric wall 241 includes silicon nitride. According to an embodiment of the present invention, the thickness of the dielectric wall 241 is greater than or equal to 10 angstroms.

According to an embodiment of the present invention, the resistive memory device 1 further includes a dielectric cap 251 disposed on the top electrode layer 230 and the dielectric wall 241. According to an embodiment of the present invention, the dielectric cap 251 includes silicon oxide.

According to an embodiment of the present invention, the resistive memory device 1 further includes spacers 261 disposed on the sidewalls of the memory stack structure SS.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A resistive memory device, comprising:
a substrate;
a dielectric layer disposed on the substrate;
a conductive via disposed in the dielectric layer; and
a memory stack structure disposed on the conductive via and the dielectric layer, wherein the memory stack structure comprises a bottom electrode layer, a resistive switching layer on the bottom electrode layer, and a top electrode layer on the resistive switching layer, wherein the top electrode layer comprises at least two physically separated sub-electrode portions.

2. The resistive memory device according to claim 1 further comprising:
a dielectric wall interposed between the at least two physically separated sub-electrode portions.

3. The resistive memory device according to claim 2, wherein the dielectric wall penetrates through an entire thickness of the top electrode layer.

4. The resistive memory device according to claim 2, wherein the dielectric wall is in direct contact with the resistive switching layer.

5. The resistive memory device according to claim 2, wherein the dielectric wall comprises silicon nitride.

6. The resistive memory device according to claim 2, wherein the dielectric wall has a thickness that is greater than or equal to 10 angstroms.

7. The resistive memory device according to claim 2 further comprising:
a dielectric cap disposed on the top electrode layer and the dielectric wall.

8. The resistive memory device according to claim 7, wherein the dielectric cap comprises silicon oxide.

9. The resistive memory device according to claim 1 further comprising:
a spacer disposed on a sidewall of the memory stack structure.

10. The resistive memory device according to claim 1, wherein the top electrode layer comprises a titanium nitride (TiN) layer and iridium (Ir) layer, and wherein the resistive switching layer comprises a tantalum pentoxide ($Ta_2O_5$) layer and a tantalum oxide ($TaO_x$) layer.

11. A method for forming a resistive memory device, comprising:
providing a substrate;
forming a dielectric layer on the substrate;
forming a conductive via in the dielectric layer; and
forming a memory stack structure on the conductive via and the dielectric layer, wherein the memory stack structure comprises a bottom electrode layer, a resistive switching layer on the bottom electrode layer, and a top electrode layer on the resistive switching layer, wherein the top electrode layer comprises at least two physically separated sub-electrode portions.

12. The method according to claim 11 further comprising:
forming a dielectric wall between the at least two physically separated sub-electrode portions.

13. The method according to claim 12, wherein the dielectric wall penetrates through an entire thickness of the top electrode layer.

14. The method according to claim 12, wherein the dielectric wall is in direct contact with the resistive switching layer.

15. The method according to claim 12, wherein the dielectric wall comprises silicon nitride.

16. The method according to claim 12, wherein the dielectric wall has a thickness that is greater than or equal to 10 angstroms.

17. The method according to claim 12 further comprising:
forming a dielectric cap on the top electrode layer and the dielectric wall.

18. The method according to claim 17, wherein the dielectric cap comprises silicon oxide.

19. The method according to claim 11 further comprising:
forming a spacer on a sidewall of the memory stack structure.

20. The method according to claim 11, wherein the top electrode layer comprises a titanium nitride (TiN) layer and iridium (Ir) layer, and wherein the resistive switching layer comprises a tantalum pentoxide ($Ta_2O_5$) layer and a tantalum oxide ($TaO_x$) layer.

* * * * *